(12) United States Patent
Miyagi et al.

(10) Patent No.: US 7,468,610 B2
(45) Date of Patent: Dec. 23, 2008

(54) ELECTRICAL CONNECTING APPARATUS

(75) Inventors: Yuji Miyagi, Aomori (JP); Hidehiro Kiyofuji, Aomori (JP); Akihisa Akahira, Aomori (JP); Yoshinori Kikuchi, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/871,765

(22) Filed: Oct. 12, 2007

(65) Prior Publication Data

US 2008/0122466 A1 May 29, 2008

(30) Foreign Application Priority Data

Nov. 29, 2006 (JP) ............................ 2006-321204

(51) Int. Cl.
*G01R 31/02* (2006.01)
(52) U.S. Cl. ..................................................... 324/754
(58) Field of Classification Search .............. 324/158.1, 324/761–762, 754, 765, 760
See application file for complete search history.

(56) References Cited

U.S. PATENT DOCUMENTS 6,066,957 A * 5/2000 Van Loan et al. ........... 324/758
6,509,751 B1 * 1/2003 Mathieu et al. ............. 324/754
6,661,244 B2 * 12/2003 McQuade et al. ........... 324/754
7,071,715 B2 * 7/2006 Shinde et al. ............... 324/754

FOREIGN PATENT DOCUMENTS

| WO | WO 2005/106504 A1 | 11/2005 |
| WO | WO 2006/126279 A1 | 11/2006 |
| WO | WO 2007/046153 A2 | 4/2007 |

* cited by examiner

*Primary Examiner*—Ha Tran T Nguyen
*Assistant Examiner*—Tung X Nguyen
(74) *Attorney, Agent, or Firm*—Ingrassia Fisher & Lorenz, P.C.

(57) ABSTRACT

An electrical connecting apparatus comprising: a circuit board on which a reinforcing plate is mounted and a plurality of first electric connections are provided; a probe board on which second electric connections corresponding to the first electric connections are provided, with a plurality of probes electrically connected to the corresponding second electric connections; an elastic connector having plural pairs of both contacts capable of contacting the first and second electric connections corresponding to each other of both boards therebetween and receiving a biasing force in directions for both contacts to separate from each other; screw members for integrally combining them; and a spacer member for holding the probe tips substantially on the same plane by tightening of the screw members. Between the reinforcing plate and the probe board, a spacer plate is inserted for adjusting a distance from the other surface of the probe board to the probe tips.

6 Claims, 3 Drawing Sheets

ELECTRICAL CONNECTING APPARATUS

TECHNICAL FIELD

The present invention relates to an electrical connecting apparatus such as a probe card for use in electrical connection of, for example, an integrated circuit which is a device under test and a tester which conducts electrical inspection for electrical test of an electric circuit.

BACKGROUND

A conventional electrical connecting apparatus of this type comprises: a circuit board having, for example, a printed circuit board (PCB); and a probe board disposed at a distance from the underside of the circuit board and provided with a plurality of probes on the underside opposing the surface which faces the circuit board (see, e.g., Patent Document 1). Between the circuit board and the probe board, there is placed an interposer including an elastic connector such as a pogo pin assembly, and through the interposer, each probe of the probe board is electrically connected to a socket provided on the circuit board. The electrical connecting apparatus is connected to a tester body by the socket. On the upside of the above-mentioned circuit board is provided a reinforcing plate for restraining warping of the circuit board. These reinforcing plate, circuit board, interposer and probe board are combined integrally by tightening screw members such as bolts to be inserted from the reinforcing plate side.

More specifically, the front end of a bolt inserted from the upside of the reinforcing plate is screwed into an anchor portion provided on the probe board and tightened. A cylindrical spacer member is mounted on each bolt. The spacer member has its one end brought into contact with the underside of the reinforcing plate and its lower end brought into contact with the top of the anchor portion. When the bolt is tightened, the spacer member keeps the distance from the underside of the reinforcing plate to the tip of each probe approximately constant in cooperation with the anchor portion into which the front end of the bolt is screwed. Thus, unless any deformation in the thickness direction such as warping or wave-like deformation is introduced to the probe board where the probes are provided, the probe tips can be held on an imaginary plane.

However, a deformation in the thickness direction is generally introduced to the probe board, and it is hard to correct this deformation sufficiently by the spacer member. This sometimes causes difference in height of the positions of the probe tips with the deformation of the probe board.

Thus, the applicant of this application proposed to form each probe on the probe board in International Application No. PCT/JP2005/009812 and International Application No. PCT/JP2005/019850 to place each probe so that the tip of the probe may be positioned on an imaginary plane with the deformation of the probe board held as it is. In the PCT/JP2005/009812, it was proposed to change the height of the respective anchor portions according to the deformation of the probe board so that the top surfaces of the respective anchor portions are located on the same plane in order to maintain the deformation of the probe board, thereby aligning the tips of the probes on the same plane. Also, in the foregoing PCT/JP2005/019850, in order to maintain the deformation of the probe board, the spacer members having different lengths according to the deformation of the probe board are applied, thereby aligning the probe tips on an imaginary plane.

Thus, by selecting the height dimension of the anchor portion according to the deformation of the probe board, or by selecting the length dimension of the spacer member whose one end contacts the anchor portion, it is possible to locate the respective tips substantially on the same plane in spite of the deformation of the probe board. Thereby, in spite of the above-mentioned deformation of the probe board, in an electrical test of the tester with a plurality of IC circuits incorporated on a semiconductor wafer, it is possible to make the tips of the respective probes contact the corresponding electrodes with substantially uniform pressing force.

Patent Document 1: International Publication No. 2005/106504

BRIEF SUMMARY

These electrical connecting apparatus are, however, used with the underside edge portion of the circuit board mounted on an edge of an annular card holder of a tester head. Therefore, the underside of the circuit board to be mounted on the card holder becomes a surface to be disposed on the holder, so that in a state where the electrical connecting apparatus are mounted on the card holder, dispersion is caused in the height positions of the imaginary plane of the probe tips, namely, the height positions of the general probe tips because of dispersion in thickness due to error in production of the circuit board. Since this dispersion causes dispersion in general needle pressure of the probes of each electrical connecting apparatus, it has been desired to restrain dispersion in probe pressure of each electrical connecting apparatus for conducting a stable electrical test.

An object of the present invention is, therefore, to provide an electrical connecting apparatus capable of keeping the general height position of the probe tips from a surface to dispose the circuit board to the probe card holder at a predetermined height position in spite of the dispersion in thickness dimension of the circuit board.

The present invention is characterized basically by inserting a spacer plate for compensating dispersion in thickness dimension of a circuit board between a reinforcing plate and a circuit board.

In other words, the electrical connecting apparatus according to the present invention is characterized by comprising: a circuit board on one surface of which a reinforcing plate is mounted and on the other surface of which a plurality of first electric connections are provided; a probe board, on one surface of which disposed at a distance from the other surface of the circuit board and opposing the circuit board, second electric connections corresponding to the first electric connections are provided and on the other surface of which a plurality of probes respectively electrically connected to the corresponding second electric connections are provided; an elastic connector disposed between the circuit board and the probe board and having plural pairs of both contact points capable of contacting the first and second electric connections corresponding to each other of both boards correspond wherein both contact points of each pair receive biasing force toward separating directions from each other; screw members for integrally combining the reinforcing plate, circuit board, elastic connector and probe board; and a spacer member for holding the probe tips substantially on an imaginary plane by tightening the screw members; and between the reinforcing plate and the circuit board, a spacer plate for adjusting the distance from the other surface of the circuit board to the imaginary plane where the probe tips are located is inserted.

It is conceivable that such a spacer plate is disposed between the circuit board and the card holder which receives the edge portion of the circuit board and between the circuit board and an interposer or between the interposer and the probe board, etc. When the spacer plate is disposed between the circuit board and the card holder, however, it is necessary to replace the spacer plate with an adequate one in each electrical connecting apparatus every time the electrical connecting apparatus is replaced, which complicates an attachment work of the electrical connecting apparatus to the card holder.

Also, when the spacer plate is disposed between the circuit board and the interposer or between the interposer and the probe board, the distance between the circuit board where the interposer is to be disposed and the probe board, namely, the distance between the opposing electric connections of each board changes. Therefore, if an elastic connector such as a pogo pin assembly is used as the interposer, contact pressure of the elastic connector to be pressed against mutually opposing electric connections of both boards will change.

More particularly, the pogo pin assembly, for example, includes pogo pins each having a pair of pogo pin contacts and a spring member between the pogo pin contacts. Each pogo pin is accommodated in a pogo pin block, and both ends of each pogo pin, namely, the front ends of a pair of pogo pin contacts are accommodated so as to be able to project from the pogo pin block at a predetermined stroke. Each pair of pogo pin contacts are pressed against the electric connections opposite to each other of the circuit board and the probe board by the biasing force of the spring member. The distance between both boards increases when the spacer plate is inserted between the circuit board and the pogo pin block of the pogo pin assembly or between the pogo pin block and the probe board. Also, when this distance increases, the contact pressure of each pogo pin contact against each electric connection of both boards lowers. Thus, when the distance between both boards surpasses a predetermined value due to insertion of the spacer board, it is feared that a stable electrical connection by the elastic connector between the circuit board and the probe board might be damaged.

On the other hand, it is not necessary in the present invention to replace the spacer plates every time the electrical connecting apparatus is replaced, because the spacer plate selected according to error in production of the circuit board to compensate dispersion in thickness dimension of the circuit board is inserted between the reinforcing plate and the circuit board, and the spacer plate is combined integrally with the reinforcing plate, circuit board, elastic connector and probe board by screw members such as bolts.

Also, since there is no relation in electrical connection between the reinforcing plate where the spacer plate is disposed and the circuit board, there is no influence. Further, the spacer plate does not cause any change in the distance between the circuit board and the probe board, so that no damage is caused to the stable electrical connecting feature by the elastic connector due to the insertion of the spacer plate.

Thus, according to the present invention, the distance from the other surface of the circuit board to each probe tip from the other surface can be adequately set in spite of dispersion in thickness dimension of each circuit board due to error in production of the circuit board, without damaging the feature of the stable electrical connection of the elastic connector. Accordingly, it becomes possible to prevent change in general needle pressure of the probes due to dispersion in thickness dimension of the circuit board to ensure an electrical inspection.

The spacer member can be disposed so as to penetrate at least the reinforcing plate and the circuit board in the thickness direction with its end portion in contact with the one surface of the probe board and to provide an anchor portion into which the front end portion of the screw member is screwed.

The tip of each probe to be provided on the probe board can be formed to be located on an imaginary plane in a state that deformation in the thickness direction of the probe board is introduced. In such a case, by adequately selecting the length dimension of the spacer member and height dimension of the anchor portion, the probe board can be assembled without correcting warping or wave-like deformation of the probe board and with such deformation kept as it is, whereby the height positions of the probes can be aligned on the imaginary plane.

It is possible to use the circuit board with the edge portion of the other surface of the circuit board mounted on the upside of the edge portion of an annular card holder of the test head, and to select the spacer plate so as to adjust the distance from the upside of the card holder to the imaginary plane where the probe tip is located.

The spacer plate can be made by overlapping a plurality of spacer plates of the same thickness dimension, and the number of the spacer plates to be used can be selected according to the thickness dimension of the circuit board.

Each spacer plate can be made of a metal plate or an insulating plate.

As the elastic connector can be used a well-known pogo pin connector which is provided with a pair of contacts disposed in pairs so as to make the respective axes coincide, the pogo pins receiving an elastic biasing force in a direction to be separated from each other and electrically connected to each other, and a pogo pin block which holds the pogo pins.

Also, if necessary, a well-known wire connector which is provided with a plurality of elastic wires disposed between respectively corresponding electric connections of the circuit board and the probe board can be used as the elastic connector. In this wire connector, both ends of each elastic wire are adapted to be both contact points thereof.

The present invention can provide an electrical connecting apparatus capable of keeping the whole height positions of probe tips at a predetermined height position in a state of being attached to the probe card holder, despite dispersion in the thickness dimension of a circuit board. Therefore, despite the dispersion in the thickness dimension due to the error in production of a circuit board, the probe tips can contact the corresponding electrodes by a predetermined pressing force, thereby increasing reliability of an electrical inspection.

DETAILED DESCRIPTION

Figure 1:
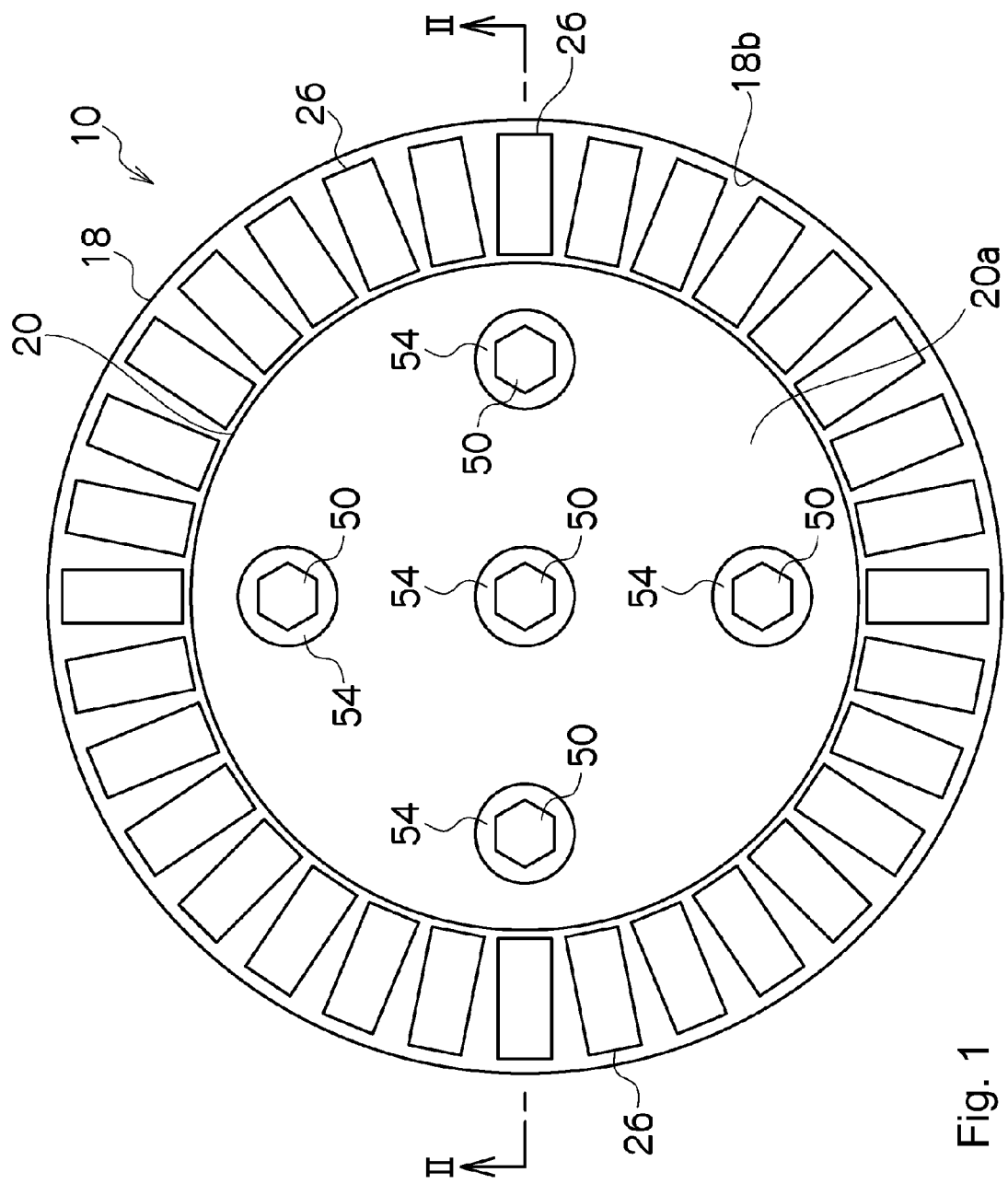
FIG. 1 is a plan view of the electrical connecting apparatus according to the present invention.
Figure 2:
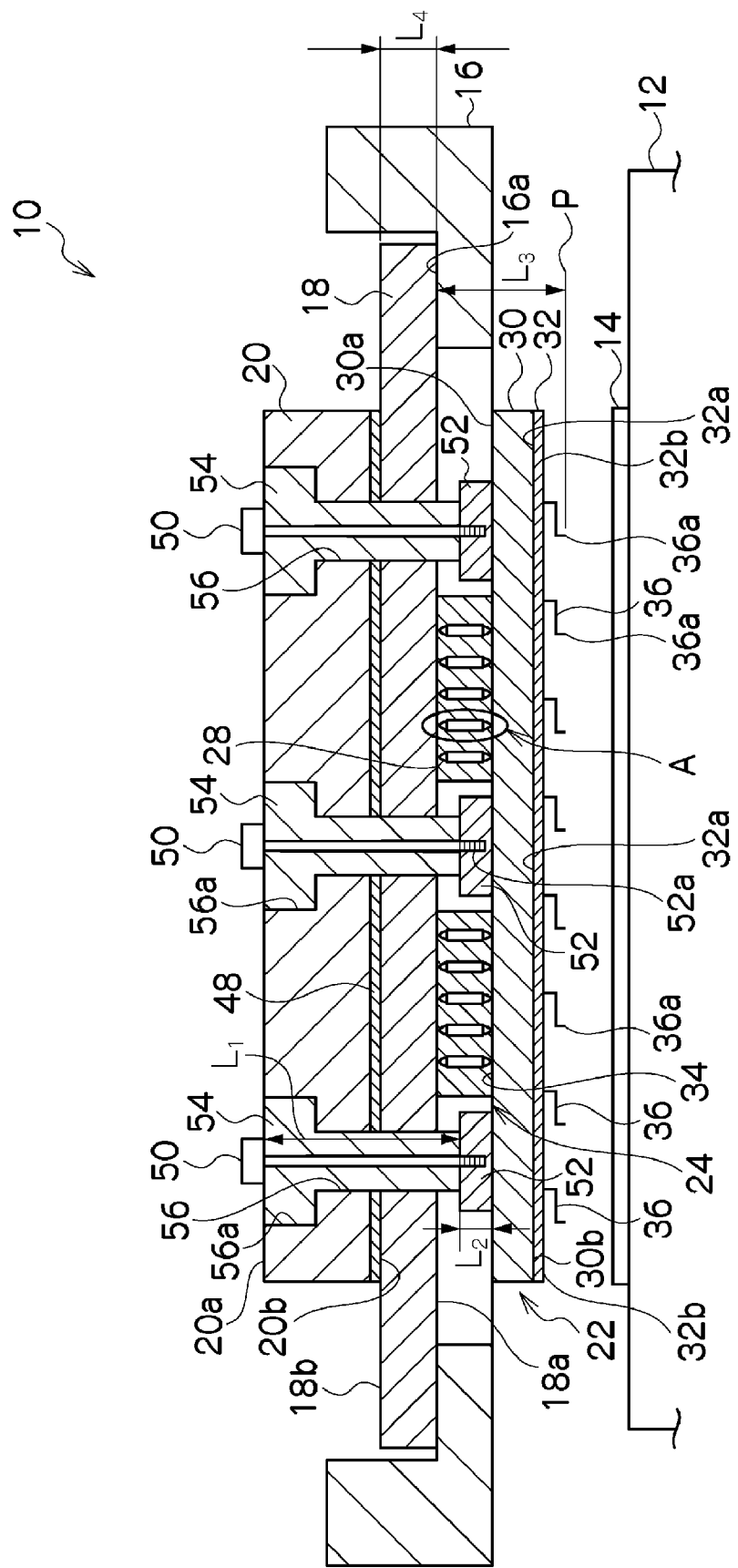
FIG. 2 is a section obtained along the line II-II shown in FIG. 1.

The electrical connecting apparatus 10 according to the present invention is shown in FIGS. 1 and 2. As shown in FIG. 2, the electrical connecting apparatus 10 is used, for instance, for an electrical inspection of a semiconductor wafer 14 on a well-known vacuum chuck 12 which constitutes a sample table of a tester. In the semiconductor wafer 14, a plurality of IC circuits (not shown) are incorporated, and for an electrical inspection of those IC circuits, the electrical connecting apparatus is used to connect each connection pad to an electric circuit of a tester body (not shown).

The electrical connecting apparatus 10 comprises, as shown in FIG. 2: a circular flat plate-like circuit board 18 having an underside 18a as an attaching surface to an annular card holder 16 to be provided at a tester head of the tester; a circular flat plate-like reinforcing plate 20 to be mounted on the upside 18b of the circuit board; a probe board 22 to be disposed at a distance from the underside 18a of the circuit board 18; and an elastic connector 24 disposed between the underside 18a of the circuit board 18 and the upside 22a of the probe board opposing the underside.

The circuit board 18 includes a printed circuit board (PCB) such as the conventional one, and as shown in FIG. 1, at an edge portion exposed from the reinforcing plate 20 of its upside 18b, a plurality of sockets 26 for electric connections to the tester are annularly arranged. In FIG. 2, the sockets 26 are omitted to simplify the view.

On the underside 18a of the circuit board 18 is formed a first electric connection 28 corresponding to each contact point of each socket 26. Each electric connection 28 is connected to one of the contact points, to which each socket 26 corresponds, through a well-known electrically conducting path (not shown).

In the example shown in FIG. 2, a probe board 22 has a ceramic plate 30 disposed to oppose to the circuit board 18 and a flexible wiring plate 32 joined to the ceramic plate. The upside 30a of the ceramic plate 30 is disposed to oppose the underside 18a of the circuit board 18, thereby forming the upside of the probe board 22 which opposes to the circuit board 18. On this upside 30a is formed a second electric connection 34 corresponding to the electric connection 28 of the circuit board 18.

The upside 32a of a wiring plate 32 is joined to the underside 30b of the ceramic plate 30, so that the underside 32b constitutes the underside of the probe board 22. On the underside of the probe board 22, namely, the underside 32b of the wiring plate 32, are provided a plurality of probes 36 corresponding to the connection pads of the semiconductor wafer 14.

On the ceramic plate 30 and wiring plate 32 constituting the probe board 22, is formed an electrically conducting path (not shown) such as the conventional one, and each probe 36 is connected to the corresponding second electric connection 34 through the electrically conducting path.

Since thermal or mechanical distortion stress is applied to the probe board 22 during a formation process of the electrically conducting path and other processes, warping in the thickness direction or wave-like deformation in the thickness direction is generally introduced to the probe board 22. A part of this deformation remains in a state that no load acts on the probe board 22. The tips 36a of the respective probes 36 are formed, as shown in FIG. 2, to align on an imaginary plane P, with the remaining non-load deformation of the probe board 22 kept as it is.

The elastic connector 24 disposed between the circuit board 18 and the probe board 22 is, in the example shown in FIG. 2, a well-known pogo pin assembly. This pogo pin assembly 24 is provided with a pogo pin block 24a to be inserted between the circuit board 18 and the probe board 22, and a plurality of pogo pins 24b to be assembled into the pogo pin block.

Figure 3:
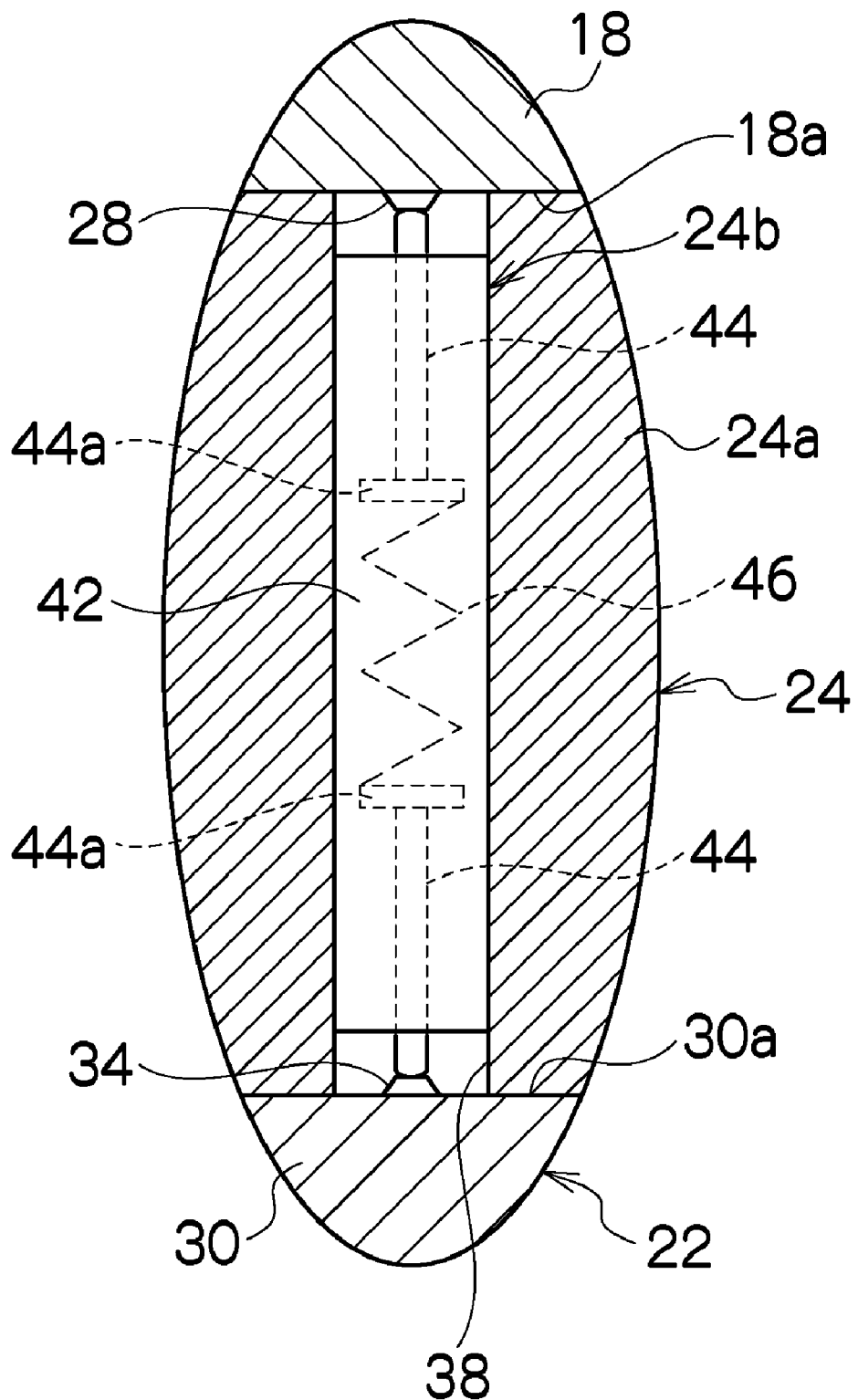
FIG. 3 is a partly enlarged section of the elastic connector shown in FIG. 2.

FIG. 3 shows region A which is enclosed with an oval in FIG. 2 partially enlarged. As shown clearly in FIG. 3, in the pogo pin block 24a of the pogo pin assembly 24, holes 38 penetrating in the thickness direction at the positions corresponding to the electric connections 28 and 34 of the circuit board 18 and the probe board 22. In the respective holes 38, the pogo pins 24b are held, making their axis directions coincident. Each pogo pin 24b is provided, as is well known, with a cylindrical member 42 to be received into the hole 38, a pair of rod-like contacts 44 to be aligned in the axial direction spaced apart from each other in the axial direction of the cylindrical member within the cylindrical member, with their longitudinal directions aligned; and a cylindrical compression coil spring 46 to be disposed within the cylindrical member 42.

At the opposing inner ends of the pair of contacts 44, engaging portions 44a for preventing falling of each contact 44 from the cylindrical member 42 are provided and disposed between the engaging portions 44a with the end portions brought into contact with the respective engaging portions 44a. The coil spring 46 electrically connects the contacts 44 and gives the biasing force to the contacts 44 in a direction for its outer ends to be apart from each other so that the outer ends of both contacts 44 may project from the end portion of the cylindrical member 42. Each outer end of both contacts 44 becomes a contact of the pogo pin 24b. The pogo pin 24b of each pogo pin assembly 24 presses both contacts which are the outer ends of the contact 44 against the corresponding electric connections 28 and 34 by the biasing force of the coil spring 46. The pogo pin assembly 24 of this type is set such that each contact 44 contacts the corresponding electric connection 28, 34 by the adequate biasing force so far as, for example, the amount of displacement by the extension and contraction between both outer ends of both contacts 44 is within about 300 μm.

The elastic connector 24 formed by this pogo pin assembly 24 is, as mentioned above, disposed between the ceramic plate 30 defining the upside 30a of the probe board 22 and the under side 18a of the circuit board 18 opposing thereto, thereby electrically connecting the opposite second electric connection 34 of the probe board 22. By this electrical connecting action of the elastic connector 24, each probe 36 is connected to the corresponding each contact of the socket 26, and to the tester body.

Also, as shown in FIG. 2, a spacer plate 48 made of a plate member having a uniform thickness dimension is inserted between the upside 18b of the circuit board 18 and the reinforcing plate 20. As mentioned later, this spacer plate 48 can be used alone or with plural plate members of equal thickness layered according to the difference in thickness of the circuit board 18 due to error in production of the circuit board 18. For such a spacer plate 48, it is possible to use an electrically conducting plate member like a stainless plate having a thickness, for example, of 100 μm, or like a polyimide film. Also, a layer with plural spacer plates 48 of different thicknesses combined can be used.

The reinforcing plate 20, spacer plate 48, circuit board 18, elastic connector 24 and probe board 22 are integrally combined by screw members 50 such as bolts. For this combination, the screw members 50 are inserted from the upside 20a of the reinforcing plate 20 into the reinforcing plate 20, spacer plate 48, circuit board 18 and elastic connector 24. Also, an anchor portion 52 having a female screw hole 52a into which the end for insertion of the screw member 50 is screwed is formed on a surface opposing the circuit board 18 of the probe board 22, namely, the upside 30a of the ceramic plate 30. The female screw hole 52a opens on the top surface of each anchor portion 52. A generally cylindrical spacer member 54 is mounted on the screw member 50 whose front end portion is screwed into the female screw hole 52a.

A flange portion 54a is formed at the upper end portion of each spacer member 54 to stretch radially outward. In the reinforcing plate 20 are formed holes 56 to allow a part excluding the flange 54a of the spacer member 54 to be inserted in the plate thickness direction. At the upper end of the hole 56 is formed an increased diameter portion 56a for receiving the flange portion 54a, so that the flange portion 54a is received in the increased diameter portion 56a such that an end surface of the hole 56 which is the upper end of the spacer member 54 coincides with the upper surface 20a of the reinforcing plate 20. The lower end of each spacer member 54 is disposed to abut the upper surface of the corresponding anchor portion 52.

In case where the tips 36a of the probes 36 are aligned on the same imaginary plane P in a state that warping or wavelike deformation is introduced to the probe board, the sum of the length dimension L1 of each spacer member 54 and the height L2 of the corresponding anchor portion 52 is set for each spacer member 54, basically to retain the warping or wavelike deformation of the probe board 22 with the underside 20b of the reinforcing plate 20 as a reference plane.

As regards this spacer member 54 and anchor portion 52, it is desirable to make the top surfaces of the anchor portions 52 align on the same plane in spite of the deformation of the base plate 22. In other words, by increasing or decreasing the length dimension 12 of the anchor portion 52 according to the deformation of the probe board 22, the top surfaces of the anchor portions 52 can be aligned on the same plane in spite of the deformation of the probe board 22, it is possible to combine the probe board 22 with the circuit board 18, reinforcing plate 20 and the like by using the spacer members 54 having the same length dimension L1 with the deformation of the probe board 22 kept.

In any case, by adequately selecting the sum of the length dimension L1 of the spacer member 54 and the height L2 of the anchor portion 52, the probe board can be assembled with the deformation of the probe board 22 kept as it is, thereby aligning the tips 36a of the probes 36 on an imaginary plane P parallel to the underside 20b of the reinforcing plate 20. The electrical connecting apparatus 10 is, however, attached to the card holder 16 such that the underside 18a of the circuit board 18 is mounted on the upside 16a of the annular edge portion of the card holder 16, so that dispersion is caused according to production error in the thickness dimension L4 of the reinforcing plate 20 to the distance L3 from the upside 16a which is to be an attachment plane of the card holder 16 to the imaginary plane P where the tips 36a of the probes 36 are positioned, as shown in FIG. 2.

Since the distance between the mounting surface of the card holder 16, i.e., the upside 16, and the chuck surface of the vacuum chuck 12 is kept constant at the time of inspection of the semiconductor wafer 14, dispersion in the distance L3 causes difference in needle pressure when the tips 36a of the probes 36 are pressed against the corresponding electrodes.

For instance, the circuit board 18, when formed with an allowable error of 6.2 mm±0.3 mm in thickness dimension, causes dispersion between 5.9 mm and 6.5 mm. Without using the spacer plate 48, therefore, there are caused differences to the pressing force of the tips 36a of the probes 36, i.e., the needle pressures of the probes 36 of the electrical connecting apparatus 10, in correspondence to differences of 0.6 mm at a maximum.

In the electrical connecting apparatus 10 according to the present invention, in spite of dispersion due to production error in the plate thickness dimension L4 of the reinforcing plate 20, the number of the spacer plates 48 selected to correspond to the plate thickness of the reinforcing plate 20 is selected so that the distance L3 from the mounting surface 16a of the card holder 16 to imaginary plate P where the tips of the probes 36 may be aligned can be kept at a proper value.

Therefore, in the electrical connecting apparatus 10 according to the present invention, where each spacer plate 48 has a thickness dimension, for example, of 100 μm, six spacer plates 48 at a maximum are laminated between the reinforcing plate 20 and the circuit board 18, and by selecting the number of proper spacer plates 48 to be inserted, thereby enabling to conduct an electrical inspection of the semiconductor wafer 14 with substantial difference in needle pressure kept almost at zero.

By the insertion of the spacer plates 48, the distance between the reinforcing plate 20 and the circuit board 18 is increased by the total thickness dimension corresponding to the number of the spacer plates 48. According to the increase in distance, however, spacer members 54 for example can be replaced with those having the proper length dimension L1.

In the electrical connecting apparatus 10 according to the present invention, the spacer plates 48 selected to compensate the dispersion in the thickness dimension of the circuit board 18 are inserted between the reinforcing plate 20 and the circuit board 28. Since the spacer plate 48 is united with the reinforcing plate 20, circuit board 18, elastic connector 24 and probe board 22 by the screw member 50, there is no need to replace the spacer plate 48 every time the electrical connecting apparatus 10 is replaced.

Since there is no relation in electrical connection between the reinforcing plate 20 and the circuit board 18 where the spacer plate 48 is disposed, no influence is given thereto. Further, there is caused no change in the distance between the circuit board 18 and the probe board 22 by the spacer plate 48. Consequently, there is no change in contact pressure of the pogo pin 24b of the elastic connector 24 by the insertion of the spacer plate 48, and no contact failure due to shortage in the contact pressure. Thus, the insertion of the spacer plate 48 does not cause damage to the feature of the stable electrical connection by the pogo pin assembly 24.

As a result, according to the present invention, there is no damage to the feature of the stable electrical connection of the elastic connector 24, and in spite of dispersion in thickness dimension of the circuit boards 18 due to production error of the circuit boards 18, the distance L3 from the underside 18a of the circuit board to the tips 36a of the probes 36 can be properly set. Thus, any change in general contact pressure of the probes 36 due to the dispersion in thickness dimension of the circuit boards 18 can be prevented, and an electrical inspection of the device under test 14 such as a semiconductor wafer is ensured.

In the foregoing, an example is shown that, in spite of the deformation of the probe board 22, the probes 36 are formed to align on the same imaginary plane P with the deformation introduced to the probe board 22 to make the tips 36a of the probes 36 align on the same imaginary plane P, and that the probe board is combined with the circuit board 18 and the reinforcing plate 20 and the like by the anchor portion 52 and the spacer member 54 so that the probe board 22 may maintain the deformation.

The present invention can be applied to an electrical connecting apparatus using, in place of this, a flat probe board without deformation and the probe tips 36a formed to align on the same imaginary plane with deformation introduced to the probe board. In this case, spacer members and anchor portions having the same length dimensions (L1, L2) are adopted as spacer members 54 and anchor portions 52.

Further, for the elastic connector 24 provided as an interposer, another elastic connector such as a well-known wire connector provided with an elastic wire can be used in place of the pogo pin assembly.

The present invention is not limited to the foregoing embodiments but can be varied without departing from its purport.

What is claimed is:

1. An electrical connecting apparatus comprising:
   a circuit board on one surface of which a reinforcing plate is mounted and on the other surface of which a plurality of first electric connections are provided;
   a probe board disposed at a distance from the other surface of said circuit board, on one surface of which facing said circuit board second electric connections corresponding to said first electric connections are provided and on the other surface of which a plurality of probes respectively electrically connected to the corresponding second electric connections are provided;
   an elastic connector having plural pairs of both contacts capable of contacting the mutually corresponding first and second electric connections of both boards and receiving a biasing force toward separating directions of both contacts of each pair;
   a screw member for integrally combining said reinforcing plate, circuit board, elastic connector and probe board; and
   a spacer member for keeping said probe tips on an imaginary plane by tightening said screw member;
   wherein a spacer plate for adjusting a distance from said other surface of said circuit board to said imaginary plane where said probe tips are located is inserted between said reinforcing plate and said circuit board; and
   wherein said spacer member is disposed so as to penetrate at least said reinforcing plate and circuit board in the thickness direction, and on said one surface of said probe board, an anchor portion is provided, with which the end portion of said spacer member is brought into contact and into which the front end of said screw member is screwed.

2. The electric connecting apparatus claimed in claim 1, wherein a deformation in the thickness direction is introduced to said probe board, wherein said probes are formed so that their tips may coincide with said imaginary plane with the deformation of the probe board maintained, and wherein said spacer member maintains the deformation of said probe board so as to hold said probe tips on said imaginary plane in cooperation with said anchor portion.

3. The electric connecting apparatus claimed in claim 1, wherein an edge portion of the other surface of said circuit board is mounted on the upside of an edge portion of an annular card holder of a test head, and wherein said spacer plate is inserted for adjusting a distance from said upside of said card holder to said imaginary plane where said probe tips are located.

4. The electric connecting apparatus claimed in claim 1, wherein said spacer plate is constituted by overlapping a plurality of spacer plates having an equal thickness dimension.

5. The electric connecting apparatus claimed in claim 1, wherein each of said spacer plates is made of a metal plate or an insulating plate.

6. The electric connecting apparatus claimed in claim 1, wherein said elastic connector is a pogo pin assembly having:
   a pogo pin including a pair of contacts disposed in pairs so as to make their axes coincide with each other and receiving an elastic biasing force in separating directions from each other to be electrically connected to each other; and
   a pogo pin block for holding said pogo pin.

* * * * *